United States Patent [19]

Shimada

[11] Patent Number: 5,079,771
[45] Date of Patent: Jan. 7, 1992

[54] BIT AND SYMBOL TIMING RECOVERY FOR SEQUENTIAL DECODERS

[75] Inventor: Michio Shimada, Tokyo, Japan

[73] Assignee: NEC Corporation, Tokyo, Japan

[21] Appl. No.: 356,048

[22] Filed: May 24, 1989

[30] Foreign Application Priority Data

May 24, 1988 [JP] Japan ................... 63-127828

[51] Int. Cl.⁵ ............................................ G06F 11/10
[52] U.S. Cl. ........................................ 371/43; 371/46
[58] Field of Search ................... 371/43, 44, 45, 46, 371/37.1, 41

[56] References Cited

U.S. PATENT DOCUMENTS

| 4,578,800 | 3/1986 | Yasuda | 371/46 X |
| 4,710,746 | 12/1987 | Shimoda | 371/43 X |
| 4,878,221 | 10/1989 | Shimada | 371/43 |

Primary Examiner—Robert W. Beausoliel
Attorney, Agent, or Firm—Sughrue, Mion, Zinn, Macpeak & Seas

[57] ABSTRACT

In a sequential decoding apparatus, a sequential decoder performs sequential decoding on convolutional code symbols stored in a data buffer according to the maximum likelihood algorithm. When the buffer is overflowed due to random noise, the sequential decoder skips a portion of the stored symbols, clears its internal state and initiates a stepwise decoding on symbols of newly arrival. A sync detector detects that a count of symbols that have been decoded after the occurrence of the overflow is lower or higher than a predetermined value. If the overflow condition still exists following the stepwise decoding, a portion of the stored symbols is further skipped and the stepwise decoding is repeated. If the overflow condition ceases to exist and if the decoded symbol count is still lower than the predetermined value, the symbol skipping and stepwise decoding are repeated until it becomes higher than the predetermined value to cause the sequential decoder to resume normal operation.

18 Claims, 7 Drawing Sheets

FIG. 1

FIG. 4A
OVERFLOW SUBROUTINE

BIT AND SYMBOL TIMING RECOVERY FOR SEQUENTIAL DECODERS

BACKGROUND OF THE INVENTION

The present invention relates generally to sequential decoders for decoding convolutional code symbols, and more specifically to recovery of bit and symbol timing for a sequential decoder.

The technique of sequentially coding digital pulses, such as convolutional code symbols, is well known in the art because of its powerful error correcting capability. The convolutional codes are generated by a convolutional encoder which consists of a K-stage shift register, v-modulo 2 adders connected to some of the shift register stages, and a commutator that scans the output of the modulo 2 adders. The convolutional encoder processes the information bits continuously in a serial fashion, a few bits at a time, and appends some parity, or redundant bits to form code symbols. Sequential decoders include a replica of the encoder which decodes the convolutional code symbols according to a decoding algorithm. The Fano algorithm is the well known technique for convolutional codes. According to this algorithm, the received code symbols are decoded by the encoder replica to recover a replica of the original symbols. If the code symbols are two-bit symbols, the encoder replica produces an output which would be one of the four possible combinations of the two incoming bits and this output is compared with the incoming code symbols. The result of the comparison is used to hypothesize one of the possible combinations as the nearest to the incoming symbols according to what is known as the Fano likelihood decision. If a false decision is made in a decoding process, the discrepancy between the internal state of the encoder replica and the internal state of the encoder itself increases as the decoding process proceeds due to the increasing difficulty to find one having the maximum Fano likelihood value. The degree of this difficulty is used as a measure for detecting whether the decoder has made an error in the past decision. Under such circumstances, the decoding procedure is repeated on the hypothesis that the next higher Fano likelihood value that has been obtained in a past decision is the most likely symbol. The process is repeated by successively tracing backwards the tree structure of the codes to correct the error. A buffer is therefore provided to store as many incoming symbols as is necessary to repeat the hypothesis on a trial-and-error basis. However, a buffer overflow and possible communication breakdown are likely to occur under noisy environment. Recovering procedures are usually applied during buffer overflows, which occur with a relatively large probability.

Bit timing and symbol timing errors are the potential sources of errors that could lead to a false decision in the sequential decoding process. Prior art recovering procedures, for example as shown and described in U.S. Pat. No. 4,878,221, involve skipping a portion of stored code symbols in response to the occurrence of a buffer overflow and shifting the bit timing of incoming code symbols by a unit value and then resetting the sequential decoder to clear its internal state. The process is repeated as long as the buffer overflow exists. However, one disadvantage of the prior art recovery procedures is that even though the correct bit timing is reestablished, it is unnecessarily shifted as long as the overflow continues. As a result, once a buffer overflow occurs, it tends to trigger a subsequent overflow and as a result a substantial amount of data must be discarded.

SUMMARY OF THE INVENTION

It is therefore an object of the present invention to provide sequential decoding apparatus which provides quick recovery of bit and symbol timing in the event of a buffer overflow to reduce the amount of data to be discarded.

According to a first aspect of the present invention, a decoding apparatus comprises a controller for writing and reading incoming code symbols having a tree code structure into and out of a data buffer and detecting when an overflow develops in the buffer. A sequential decoder performs the normal operation of sequential decoding on code symbols in the buffer in the absence of the buffer overflow, and in responsive to the detection of a buffer overflow it clears its internal state and performs a stepwise decoding on code symbols located a distance from those code symbols which would be decoded in the absence of the overflow condition, the distance corresponding to a plurality of code symbols. A sync detector detects a count that indicates the amount of code symbols which have been decoded by the sequential decoder since the occurrence of the buffer overflow and generates a first indication if the detected count is lower than a predetermined value and a second indication when it becomes higher than the predetermined value. The sequential decoder is responsive to the first indication to repeat the stepwise decoding and further responsive to the second indication for resuming the normal operation.

Preferably, the decoding apparatus includes a bit timing corrector for shifting the bit timing of the incoming code symbols by a unit value each time the stepwise sequential decoding is performed by the sequential decoder.

According to a specific aspect, the decoding apparatus of the invention comprises a first address generator for generating a first address and a second address generator for generating a second address. A sequential decoder performs normal sequential decoding on code symbols in a data buffer addressed by the second address in the absence of a buffer overflow and discontinues the normal operation in the presence of the buffer overflow. A sync detector is responsive to a reset signal applied thereto for detecting a count of code symbols which have been decoded since the detection of the buffer overflow. A controller writes and read incoming code symbols into and out of the buffer in accordance with the first address and is programmed to detect whether the buffer overflow exists in the buffer. If the buffer overflow is detected, it causes the second address generator to advance its address by a predetermined amount corresponding to a plurality of code symbols to skip a portion of code symbols of earlier arrival. A reset signal is supplied to the sync detector means and the sequential decoder is reset, clearing its internal state, to effect a stepwise decoding on code symbols of later arrival. If the overflow condition ceases to exist in the buffer, the decoded symbol count is interrogated to detect if it is higher or lower than a predetermined value. If higher than the predetermined value, the stepwise decoding is repeated and if not, the sequential decoder is allowed to resume the normal operation. If the overflow condition still exists, the symbol skipping and stepwise decoding is repeated.

BRIEF DESCRIPTION OF THE DRAWINGS

The present invention will be described in further detail with reference to the accompanying drawings, in which.

DESCRIPTION OF THE PREFERRED EMBODIMENTS

Figure 1:
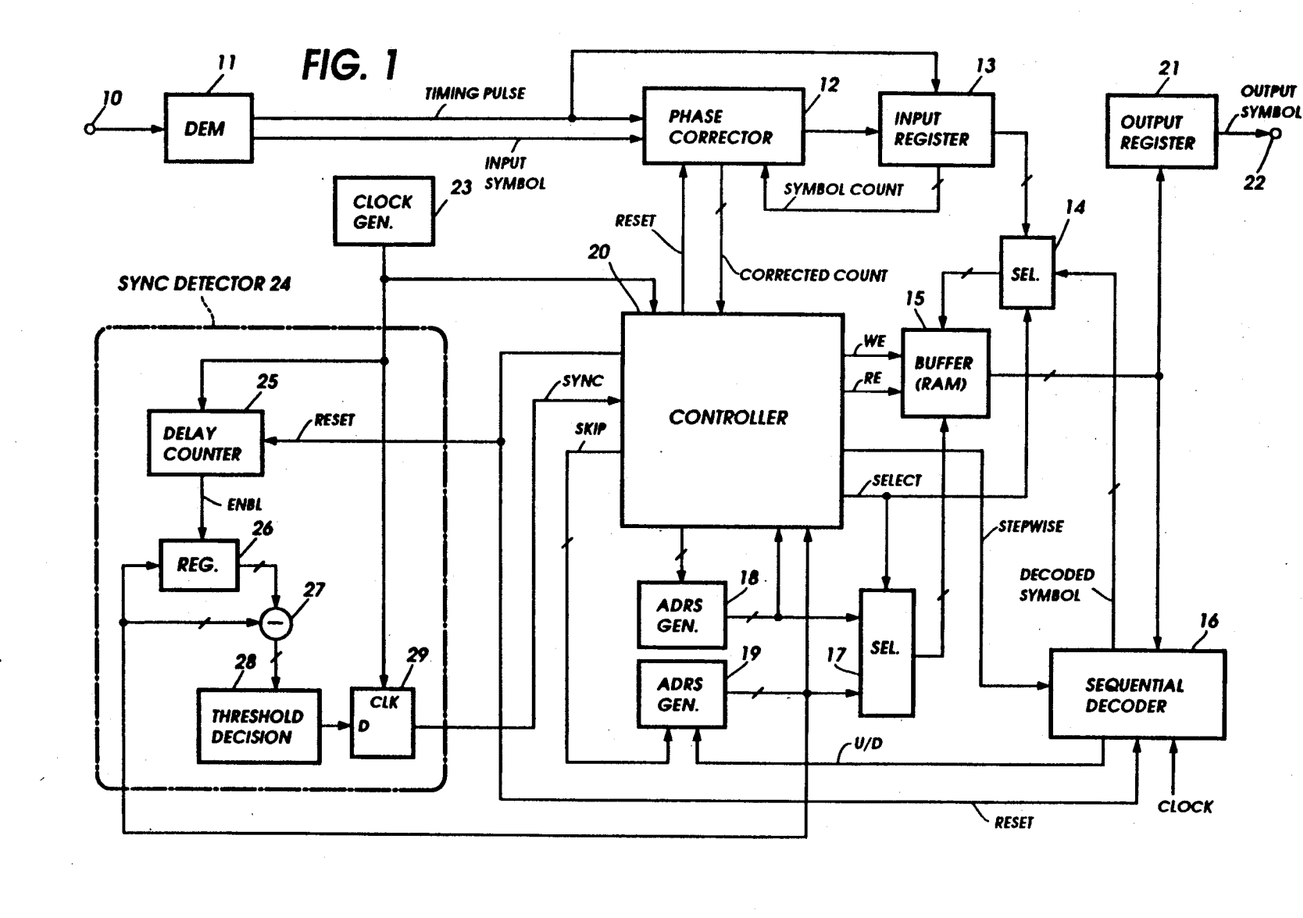
FIG. 1 is a block diagram of a sequential decoding apparatus incorporating a sync detector of a first preferred embodiment of the present invention.

Referring now to FIG. 1, there is shown a sequential decoding apparatus according to a preferred embodiment of the present invention which is particularly intended for use in a satellite communications system. The sequential decoding apparatus of the invention includes a demodulator 11 connected to an input terminal 10 to which digitally modulated convolutional code symbols are supplied from an earth station antenna. Using a known demodulation technique, modulated incoming code symbols are detected and bit timing pulses are recovered and fed to a bit timing phase corrector 12. The bit timing pulse is further applied to an input register 13 to which the output of phase corrector 12 is also applied.

As will be described, the input register 13 provides a symbol count to the phase corrector 12 to permit it to detect a phase error for correcting the phase timing of the incoming symbols in response to a reset pulse supplied from a controller 20. The output of input register 13 is connected to a first input of a selector 14.

A sequential decoder 16 provides a decoded symbol to the second input of selector 14. In response to a select signal from the controller 20, the signal at one of the inputs of selector 14 is coupled to a data input port of a buffer, or random access memory 15 having a capacity sufficient to hold as many symbols as necessary for sequential decoder 16 to correct errors by tracing backwards in the tree structure of the convolutional codes in the event of a false decision in the normal sequential decoding process. Buffer 15 has an address input port connected to the output of a selector 17 which is responsive to the select signal from the controller 20 to selectively supply a read/write address code from an address generator 18 or a read/write address code from an address generator 19. Address generator 18 is under the control of controller 20 and acts as an input/output address counter to provide the address locations of incoming coded symbols entering the buffer 15 and outgoing decoded symbols leaving it. Address generator 19 is under the control of sequential decoder 16 as well as controller 20 and acts as a error-correcting address counter by providing the address locations of stored code symbols to be sequentially decoded by the decoder 16.

When controller 20 detects that the corrected symbol count from phase corrector 12 exceeds a predetermined value, it applies a write enable (WE) pulse to buffer 15 and selects the outputs of address generator 18 and input register 13 to write input convolutional code symbols in parallel form into those locations of buffer 15 specified by the address generator 18. After decoding, controller 20 applies a read enable (RE) pulse to buffer 15 and reads a sequence of stored code symbols out of the memory 15 into an output register 21 which is coupled to an output terminal 22.

The outputs of address generators 18 and 19 are further connected to controller 20. Controller 20 includes a decision logic to detect the difference between the address counts of address generators 18 and 19 and compares the difference with a variable threshold value and determines that the buffer 15 is overflowed when the difference exceeds the threshold. As will be described, this threshold is lowered upon the detection of a buffer overflow and restored to normal when the bit and symbol timing of the system is reestablished.

Sequential decoder 16 is of a conventional design which includes a replica of the encoder which is essentially a shift register to which information bits are sequentially supplied, modulo 2 adders coupled to the shift register stages, and a commutator which scans the outputs of modulo 2 adders. Decoder 16 has error correcting capability. During normal decoding process, decoder 16 reads the stored symbols specified by the output of address generator 19. Whenever an error occurs in the maximum likelihood decision, decoder 16 traces backwards the branches of the tree structure of the convolutional code symbols by controlling the address generator 19 through an up/down control line and reading previously decoded symbols and corrects and rewrites them into buffer 15.

As will be described in more detail, in the event of a buffer overflow, controller 20 interprets this situation that some of the stored symbols have been overwritten with incoming symbols and proceeds to apply a signal through a skip control line to address generator 19 to advance its address count by a predetermined amount corresponding to plural code symbols to permit sequential decoder 16 to skip a portion of the stored code symbols waiting to be decoded, and then resets the phase corrector 12 to shift the bit timing of the incoming symbols by a unit value.

Controller 20 then proceeds to reset, or initialize the internal state of the sequential decoder 16 and enables it to effect a stepwise decoding operation on a prescribed number of symbols stored in buffer 15. Simultaneously with the initialization of sequential decoder 16, a sync detector 24 is also reset to begin a search for a sync condition in which the correct bit and symbol timing of the incoming code symbols is searched.

The amount of the skipped code symbols is sufficient to restore the system to normal if the amount of overflowed code symbols is not substantial so that a single skipping causes a buffer overflow of normal size to cease. If the overflow condition still continues, controller 20 interprets the overflow as a severe condition and sends the skip command signal again to the address generator 19 and reinitializes the sequential decoder 16 to repeat the stepwise decoding. The above process will be repeated until the system timing approaches the correct timing.

If the overflow condition ceases in response to the skipping operation, controller 20 interrogates the output of sync detector 24 to check to see if the system has attained a sync condition. If not, controller 20 enables sequential decoder 16 again to effect the stepwise decoding by incrementing the address generator 19 by a unit value.

Sync detector 24 includes a delay counter 25 which responds to the same reset signal as one that initializes the sequential decoder 16 by starting count operation on clock pulses from a clock detector 23. Delay counter 25 produces an output when a prefixed count value is reached. The prefixed count value is determined so that the amount of time elapsed between the time the delay counter 25 is reset and the time at which the prefixed count value is reached is greater than the time taken to initialize the sequential decoder 16. The output of delay counter 25 is applied as an enable pulse to a register 26 for latching the output of address generator 19. The latched address count is applied to a subtractor 27 to which the output of address generator 19 is also applied. The difference between the latched address count and the output of address generator 19 is detected by subtractor 27 and applied to a threshold decision circuit 28 for making a comparison with a prescribed threshold. When the threshold is exceeded, a logic-1 is applied to the data input of a D-type flip-flop 29. In response to a clock pulse from clock detector 23, the output of flip-flop 29 switches to the logic state of its D input and supplies a logic-1 output to the controller 20 as an indication that a sync condition has been established.

Figure 2:
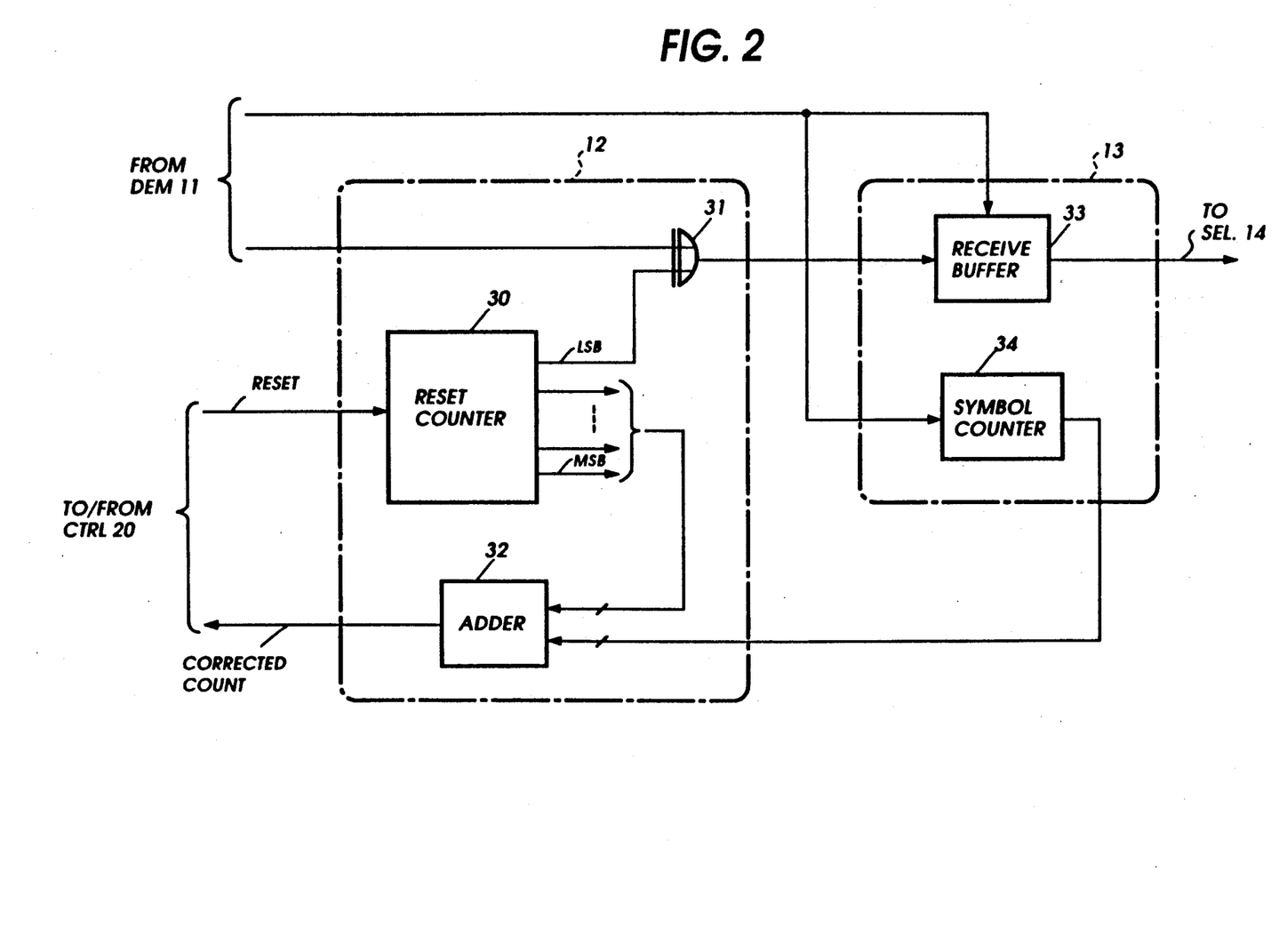
FIG. 2 is a block diagram of the bit timing corrector and input register of FIG. 1.

Prior to detailed description of the operation of the sequential decoding apparatus, reference is made to FIG. 2 in which details of phase corrector 12 and input register 13 are illustrated. Phase corrector 12 includes a reset counter 30 which provides a binary count of reset pulses supplied from the controller 20. The least significant bit of the binary count is supplied to one input of an exclusive OR gate 31 by which code symbols from the demodulator 11 are modulo 2 summed with the LSB. The remainder of the binary outputs of counter 30 are supplied to an adder 32.

Input register 13 includes a receive buffer 33 in which the modulo 2 sum output of exclusive OR gate 31 is sequentially stored prior to delivery to the selector 14. The bit timing pulse from demodulator 11 is applied to a symbol counter 34 as well as to receive buffer 33. Symbol counter 34 generates a binary signal representing a count of received code symbols. The output of counter 34 is supplied to adder 32 to be summed with the binary outputs of reset counter 30 except the LSB, the number of bits presented to both inputs of adder 32 being equal to each other and further equal to the number of bits appearing at the output of adder 32. Carry output is thrown away. The output of adder 32 is applied to the controller 20 as a corrected count of input code symbols.

A reset signal applied from the controller 20 causes a count to be incremented in the reset counter 30, resulting in a logic-1 output at the LSB output so that the binary logic state of an incoming bit is reversed, resetting the bit timing of the incoming code symbol by a single bit with respect to the bit timing of the sequential decoding apparatus.

Figure 3:
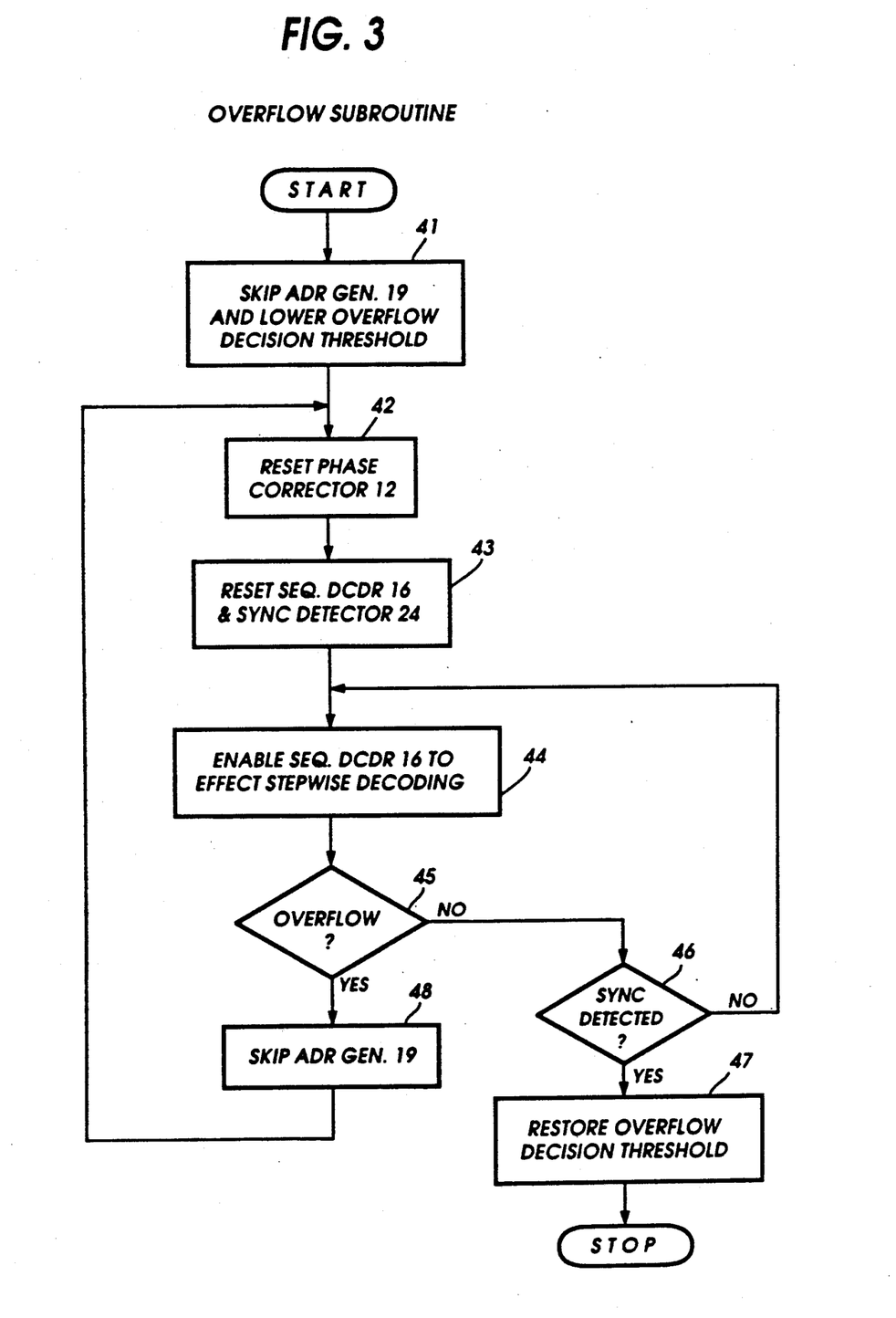
FIG. 3 is a flowchart describing the operation of the controller of FIG. 1 according to an embodiment of the present invention.

The operation of controller 20 during a buffer overflow proceeds in an overflow subroutine as illustrated in FIG. 3. When the difference between the outputs of address generators 18 and 19 exceeds the variable threshold, controller 20 determines that a buffer overflow has occurred. Program execution proceeds with operations block 41 which directs the application of a skip command signal to address generator 19 to advance its address count by a prescribed count and directs the lowering of the overflow decision threshold so that the effective area of the buffer 15 in which the sequential decoder 16 performs decoding is limited.

Exit then is to operations block 42 in which controller 20 applies a reset pulse to the phase corrector 12 to shift the bit timing of the incoming code symbols by a unit value with respect to the system's bit timing. Program control proceeds to operations block 43 to reset, or initialize the sequential decoder 16 by clearing its internal state as well as resetting the sync detector 24 to start a sync recovery process and goes to operations block 44 to supply a signal through the stepwise control line to sequential decoder 16 to enable it to effect a stepwise decoding on a preselected number of symbols. In response to the stepwise control signal, sequential decoder 16 sends a signal through an up/down control line to address generator 19 to cause it to increment its count by a unit value to address symbols stored in the buffer 15. Sequential decoder 16 then performs the stepwise decoding on the symbols addressed by the incremented address count.

Exit then is to decision block 45 which directs the detection of a difference between the outputs of address generators 18 and 19 to compare it with the lowered overflow decision threshold. If the difference is higher than the lowered threshold, control interprets that the overflow condition is still present. If the overflow condition initially detected by controller 20 is of a relatively small scale, the answer in decision block 45 will be negative and exit then is to operations block 46 to check to see if the output of flip-flop 29 is logic-1 or logic-0. If sequential decoder 16 is still out of sync with the symbols, the output of flip-flop 29 is logic-0, control returns to operations block 44 to enable sequential decoder 16 to perform the stepwise decoding again. Therefore, as long as the out-of-sync condition prevails, blocks 44, 45 and 46 following the detection of a buffer overflow of a small scale. Upon detection of a logic-1 at the output of sync detector 24, control interprets that a sync condition has been reestablished and advances to operations block 47 to restore the overflow decision threshold to normal.

If the scale of the buffer overflow is relatively large, the answer in decision block 45 will be affirmative and control exits to operations block 48 to send a skip command signal the address generator 19 to cause sequential decoder to further skip a portion of the stored code symbols. Control then returns to operations block 42 to reset the phase corrector 12 to shift its bit timing by a unit value, moves to block 43 to reset the sequential decoder 16 and sync detector 24 again, and proceeds to block 44 to enable sequential decoder 16 to perform a stepwise decoding on symbols specified by the address count incremented by block 48. As long as the buffer overflow prevails, the shifting of the bit timing of incoming code symbols, the skipping of code symbols in buffer 15, and the stepwise decoding of the skipped code symbols will be repeatedly performed. When the sync timing of sequential decoder 16 approaches the sync timing of code symbols, control exits decision block 46 and enters the operations block 46 to restore the overflow decision threshold after executing blocks 44 and 45 in a manner as described above.

While satisfactory for applications in which random noise occurs frequently, the sync search algorithm described above is not suitable for applications in which bit timing errors occur infrequently due to the use of high precision modulators and demodulators since there is a likelihood of the bit timing of the incoming code symbols being unnecessarily shifted by the resetting operation.

Figure 4A:
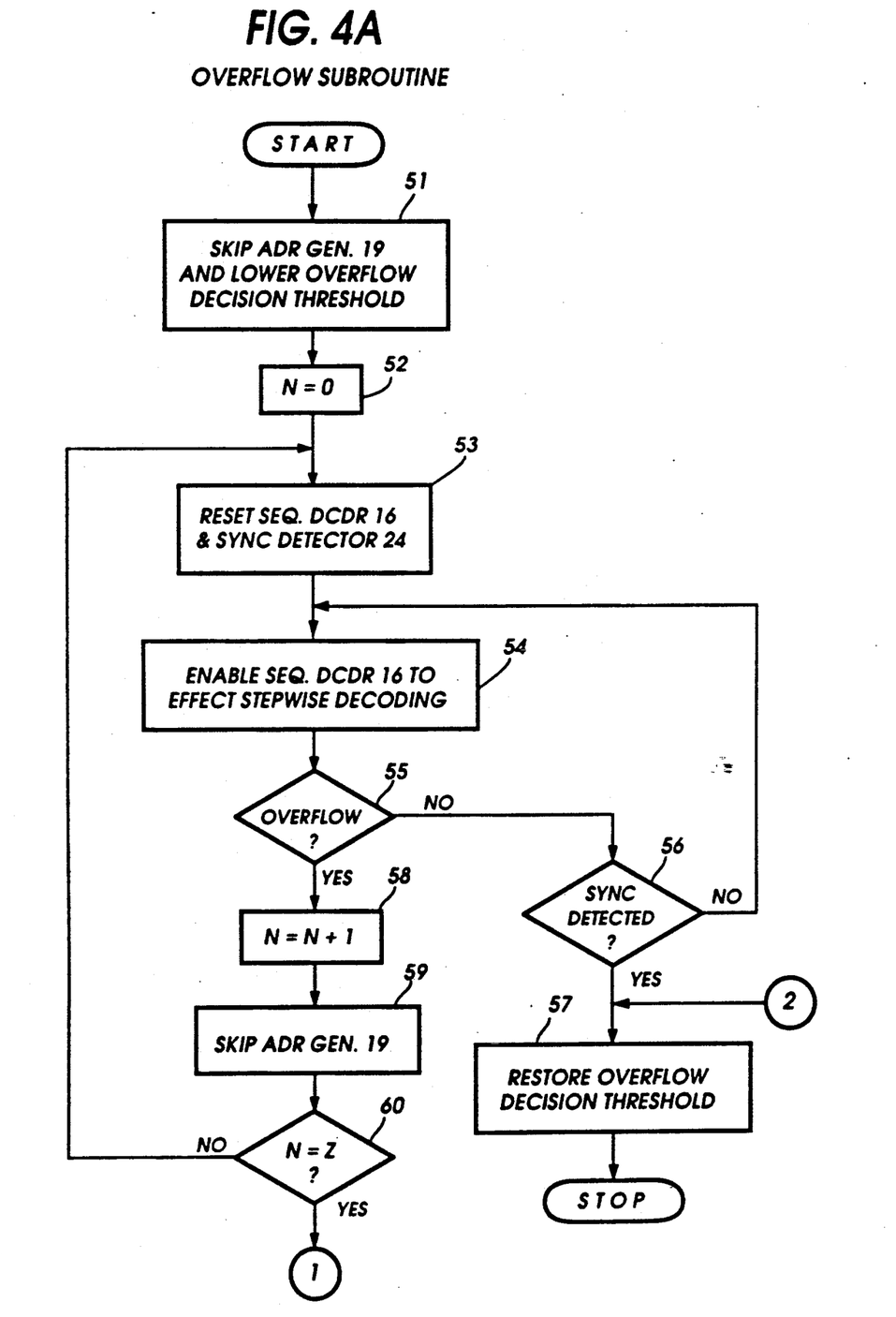
FIGS. 4A and 4B are flowcharts describing the operation of the controller of FIG. 1 according to a modified embodiment.
Figure 4B:
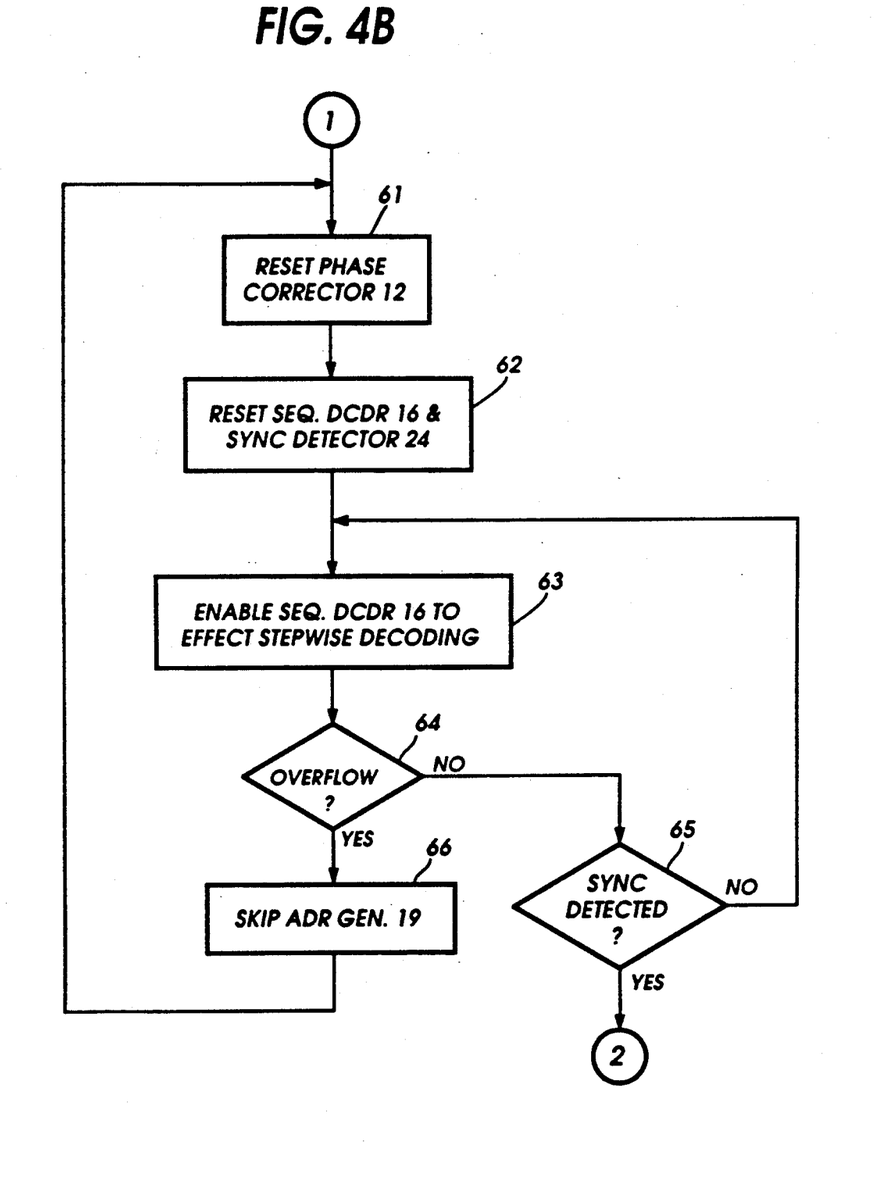

A sync search algorithm suitable for such applications is shown in FIGS. 4A and 4B. Briefly stated, this algorithm differs from the previous embodiment by deferring the bit timing resetting subroutine until the stepwise decoding is repeatedly performed on skipped codes a predetermined number of times. If a buffer overflow is detected by controller 20, control begins executing operations block 51 which directs the skipping of address generator 19 and the lowering of the overflow decision threshold in a manner similar to the block 41 of FIG. 3.

Exit then is to operations block 52 which directs the setting of a count value N to zero. Program control exits to operations block 53 to reset sequential decoder 16 and sync detector 24. Sequential decoder 16 is then enabled to effect a stepwise decoding on the skipped code symbols (block 54). Decision block 55 which follows senses the difference between the outputs of address generators 18 and 19 to determine if the difference exceeds the lowered overflow decision threshold. If buffer overflow condition ceases, the answer is negative in block 55 and control enters a sync search process by sensing the output of sync detector 24 in block 56 to determine whether the stepwise decoding is to be further performed or not. If the answer is affirmative, control advances to block 57 to restore the overflow decision threshold to normal, and if it is negative, blocks 54, 55 and 56 are repeated.

As described above, if the overflow condition still exists and hence the answer in block 55 is affirmative, control exits to block 58 to increment the count value N by one. Address generator 19 is skipped again by a predetermined count (block 59) and control proceeds to decision block 60 which checks to see if the count N is equal to a preset value Z. If the answer is negative, control returns to operations block 53 to repeat the skipping and stepwise decoding process until the preset value Z is reached, provided that the overflow condition still prevails.

If the preset value Z is reached, program control exits from decision block 60 and enters operations block 61 which resets the phase corrector 12. Sequential decoder 16 and sync detector 24 are reset again (block 62). Address generator 19 is incremented by a unit value by sequential decoder 16 to perform a stepwise decoding (block 63) and the overflow condition is again checked in block 64. If the buffer overflow discontinue, control executes decision block 65 by checking the output of sync detector 24 in a manner similar to block 56. If the output of sync detector 24 is at logic-0 level, blocks 63, 64 and 65 are repeated to effect the stepwise decoding on continuously incremented code symbols. If a logic-1 develops at the output of sync detector 24, control advances to operations block 57 to restore the overflow decision threshold.

If the answer is affirmative in block 64, address generator 19 is again skipped (block 66) and blocks 61 through 64 are repeated to shift the bit timing of phase corrector 12 and repeat the resetting of decoder 16 and sync detector 24 for stepwise decoding on symbols which are skipped in block 66.

Figure 5:
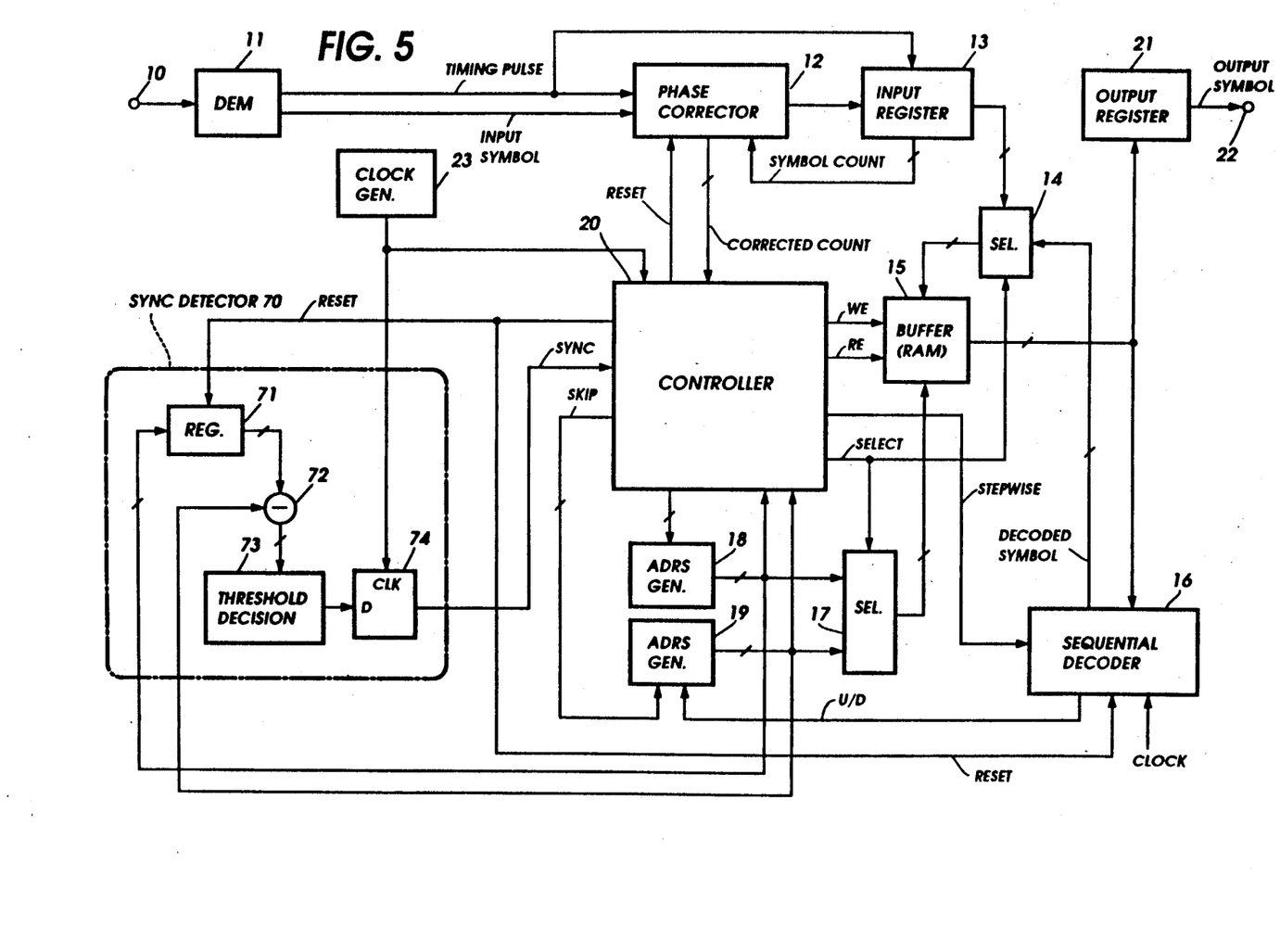
FIG. 5 is a block diagram of a sequential decoding apparatus incorporating another form of the sync detector of the present invention.

An alternative form of the sync detector is shown in FIG. 5. Sync detector 70 comprises a register 71, a subtractor 72, a threshold decision circuit 73 and a D-type flip-flop 74. Register 71 takes input from the output of address generator 18 and is arranged to be reset in response to the same reset signal as applied to the sequential decoder 16 from the controller 20. Subtractor 72 detects the difference between the output of register 71 and the output of address generator 19 and supplies its output to the threshold decision circuit 73.

In operation, the occurrence of a buffer overflow causes a reset signal to be applied from the controller 20 to the sequential decoder 16 as well as to the register 71 to latch the address count from address generator 18. If the difference detected by subtractor 72 reaches a prescribed threshold, a logic-1 output is supplied from the decision circuit 73 to the flip-flop 74 and a logic-1 output will be subsequently supplied therefrom in response to a clock pulse from clock recovery circuit 23 to the controller 20 as an indication that a sync condition has been reestablished.

Figure 6:
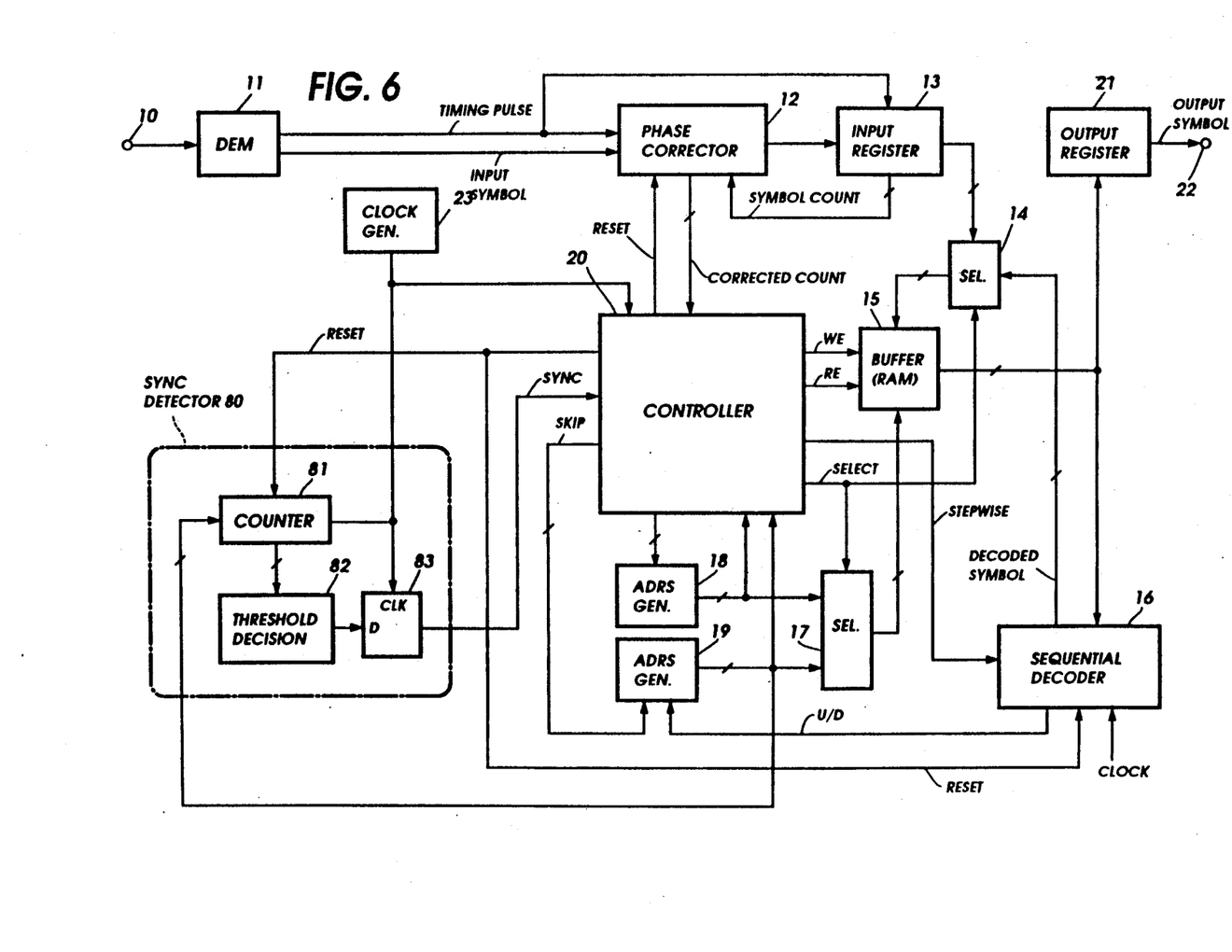
FIG. 6 is a block diagram of a sequential decoding apparatus incorporating a further modified form of the sync detector of this invention.

FIG. 6 is a further modification of the sync detector. In this modification, sync detector 80 includes a programmable counter 81, a threshold decision circuit 82 and a D-type flip-flop 83. The up/down control signal from the sequential decoder 16 is applied to the counter 81. Responsive to the reset signal from controller 20, counter 81 is preset to the output of address generator 19 and starts counting clock pulses and generates a binary count which is continuously compared by the threshold decision circuit 82 with a prescribed threshold. When the latter is exceeded, a logic 1 is applied to the D input of flip-flop 83 which in turn supplies a logic 1 in response to a subsequent clock pulse to the controller 20 as an indication of the reestablishment of a sync condition.

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

What is claimed is:

1. A decoding apparatus, comprising:
   a buffer;
   control means for writing and reading incoming code symbols having a tree code structure into and out of said buffer and for detecting when an overflow condition develops in said buffer;
   sequential decoder means for performing normal sequential decoding on the incoming code symbols in said buffer in the absence of the overflow condition, and responsive to the detection of the overflow condition for clearing an internal state of said sequential decoder means and for performing a stepwise decoding on the incoming code symbols in said buffer located a distance from the incoming code symbols which would be decoded in the absence of the overflow condition, the distance corresponding to a plurality of code symbols; and
   sync detector means for detecting an amount of the incoming code symbols decoded by said sequential decoder means after the overflow condition is detected and for generating a first indication when the amount detected is lower than a predetermined value and a second indication when the amount detected becomes higher than the predetermined value, said sequential decoder means being responsive to the first indication to repeat the stepwise decoding and responsive to the second indication for resuming the normal sequential decoding.

2. A decoding apparatus as claimed in claim 1, wherein said control means includes:

first address generator means for generating a first address code for writing and reading the incoming code symbols into and out of locations of said buffer specified by the first address code in the absence of the overflow condition; and second address generator means for generating a second address code which varies in opposite directions in the absence of the overflow condition in accordance with the normal sequential decoding operation of said sequential decoder means, said second address code being repeatedly advanced by a preset value corresponding to a plurality of the incoming code symbols in the presence of the overflow condition, and incremented by a unit value immediately following each advancement of the second address code.

3. A decoding apparatus as claimed in claim 2, wherein said sync detector means comprises means for latching the second address code in response to the detection of the overflow condition, detecting a difference between the second address code latched and a current value of the second address code, and generating the first and second indications when the difference is lower and higher than a predetermined value, respectively.

4. A decoding apparatus as claimed in claim 2, wherein said sync detector means comprises means for latching the first address code in response to the detection of the overflow condition, detecting a difference between the first address code latched and the second address code, and generating the first and second indications when the difference is lower and higher than a predetermined value, respectively.

5. A decoding apparatus as claimed in claim 2, wherein said sync detector means comprises means for receiving the second address code from said second address generator means in response to the detection of the overflow condition and periodically incrementing the second address code received, and generating the first and second indications when the incremented second address code is lower and higher than a predetermined value, respectively.

6. A decoding apparatus as claimed in claim 1, further comprising bit timing corrector means operable during the presence of the overflow condition for successively shifting bit timing of the incoming code symbols by a unit value each time said sequential decoder means performs the stepwise decoding.

7. A decoding apparatus, comprising:

a buffer;

first address generator means for generating a first address;

second address generator means for generating a second address;

sequential decoder means for performing a normal operation of sequential decoding on code symbols in said buffer addressed by said second address in the absence of a buffer overflow and discontinues said normal operation in the presence of said buffer overflow;

sync detector means operable in response to a reset signal applied thereto for detecting an address value by which said second address has incremented during a period running from the time said reset signal is applied; and control means for writing the code symbols into said buffer and reading the code symbols therefrom in accordance with said first address, said control means being programmed to sequentially perform the steps of:

a) detecting whether said buffer overflow exists in said buffer;

b) if said buffer overflow is detected by the step (a), causing said second address generator means to advance said second address by a predetermined amount corresponding to a plurality of code symbols;

c) resetting said sequential decoder means and said sync detector means;

d) causing said sequential decoder means to effect a stepwise decoding on the code symbols addressed by an incremental value of said second address;

e) detecting whether said buffer overflow condition still exists;

f) if said buffer overflow is not detected by the step (e), detecting whether said address value of said sync detector means is higher or lower than a predetermined address threshold;

g) if said address value is detected as being lower than said predetermined address threshold by the step (f), repeating the steps (d) and (e);

h) if said address value is detected as being higher than said predetermined address threshold by the step (f), causing said sequential decoder means to resume said normal operation; and i) if said buffer overflow is detected by the step (e), repeating the steps (b) to (e).

8. A decoding apparatus as claimed in claim 7, wherein said control means is further programmed to sequentially perform the following steps between the steps (b) and (c):

A) setting a count value N to zero;

B) resetting said sequential decoder means and said sync detector means;

C) causing said sequential decoder means to effect a stepwise decoding on the code symbols addressed by an incremental value of said second address;

D) detecting whether said buffer overflow still exists;

E) if said buffer overflow is not detected by the step (D), detecting whether said address value of said sync detector means is higher or lower than said predetermined address threshold;

F) if said address value is detected as being lower than said predetermined address threshold by the step (E), repeating the steps (C) and (D);

G) if said address value is detected as being higher than said predetermined address threshold by the step (E), causing said sequential decoder means to resume said normal operation;

H) if said buffer overflow is detected by the step (D), incrementing the count value N by a prescribed unit value and causing said second address generator means to advance by said predetermined amount;

I) detecting whether the count value N is equal to or greater than a predetermined count threshold;

J) if the count value N is detected as being not equal to or greater than said predetermined count threshold by the step (I), repeating the steps (B) to (D); and K) if the count value N is detected as being equal to or greater than said predetermined count threshold by the step (I), repeating the steps (c) to (i).

9. A decoding apparatus, comprising:
bit timing correction means for shifting bit timing of incoming code symbols having a tree code structure by a unit value in response to a reset signal applied thereto;
a buffer;
first address generator means for generating a first address;
second address generator means for generating a second address;
sequential decoder means for sequentially decoding the incoming code symbols in said buffer addressed by said second address;
sync detector means operable in response to said reset signal applied thereto for detecting an address value by which said second address has incremented during a period running from the time said reset signal is applied thereto; and
control means for writing and reading the incoming code symbols from said bit timing corrector means into and out of said buffer in accordance with said first address, said control means being programmed to sequentially perform the steps of:
 a) detecting a parameter indicative of the amount of the incoming code symbols in said buffer waiting to be decoded by said sequential decoder means,
 b) detecting when said parameter becomes higher than an overflow decision threshold as an indication of detection of said buffer overflow and reducing said overflow decision threshold to a lower decision threshold;
 c) causing said second address generator means to advance said second address by a predetermined amount corresponding to a plurality of the incoming code symbols;
 d) resetting said bit timing correction means;
 e) resetting said sequential decoder means and said sync detector means;
 f) causing said sequential decoder means to effect a stepwise decoding on the incoming code symbols addressed by an incremental value of said second address;
 g) detecting whether said buffer overflow still exists;
 h) if said buffer overflow is not detected in the step (g), detecting whether said address value of said sync detector means is higher or lower than a predetermined address threshold;
 i) if said address value is detected as being lower than said predetermined address threshold by the step (g), repeating the steps (f) to (g);
 j) if said address value is detected as being higher than said predetermined address threshold by the step (g), restoring said overflow decision threshold; and
 k) if said buffer overflow condition is detected by the step (g), repeating the steps (c) to (g).

10. A decoding apparatus as claimed in claim 9, wherein said control means is further programmed to sequentially perform the following steps between the steps (c) and (d):
 A) resetting a count value N;
 B) resetting said bit timing corrector means;
 C) resetting said sequential decoder means and said sync detector means;
 D) causing said sequential decoder means to effect a stepwise decoding on code symbols addressed by an incremental value of said second address;
 E) detecting whether said buffer overflow still exists;
 F) if said buffer overflow is not detected by the step (E), detecting whether said address value of said sync detector means is higher or lower than said predetermined address threshold;
 G) if said address value is detected as being lower than said predetermined address threshold by the step (F), repeating the steps (D) and (E);
 H) if said address value is detected as being higher than said predetermined address threshold by the step (F), restoring said overflow decision threshold;
 I) if said buffer overflow is detected by the step (E), incrementing the count value N by a prescribed unit value and causing said second address generator means to advance said second address by said predetermined amount;
 J) detecting whether the count value N is equal to or greater than a predetermined count threshold;
 K) if the count value N is detected as being not equal to or greater than said predetermined count threshold by the step (J), repeating the steps (B) to (J); and
 L) if the count value N is detected as being equal to or greater than said predetermined count threshold by the steps (J), repeating the steps (d) to (k).

11. A method for recovering a synchronous condition during decoding of coded symbols, said method comprising the steps of:
 a) receiving the coded symbols;
 b) storing the coded symbols received in step (a) into a storage unit;
 c) performing normal sequential decoding on the coded symbols stored in step (b);
 d) detecting an overflow condition in the storage unit using a decision threshold value; and
 e) performing stepwise decoding on a predetermined amount of the coded symbols stored in the storage unit when said detecting in step (d) detects the overflow condition.

12. A method as claimed in claim 11, wherein said method further comprises the steps of:
 f) lowering the decision threshold value to produce a lowered decision threshold value; and
 g) determining, subsequent to step (e), whether the overflow condition is still present using the lowered decision value.

13. A method as claimed in claim 12, wherein said method further comprises the steps of:
 h) determining whether the synchronous condition is recovered after said determining in step (g) determines that the overflow condition is no longer present; and
 i) repeating steps (e)-(g) when said determining in step (g) determines that the overflow condition is still present.

14. A method as claimed in claim 13, wherein said method further comprises the step of:

j) shifting bit timing of the coded signals by a unit value when said detecting in step (d) detects the overflow condition.

15. A method as claimed in claim 14, wherein said method further comprises the steps of:

k) increasing a count number each time after step (g); and l) delaying said shifting in step (j) until the count number equals a predetermined count threshold.

16. A method as claimed in claim 11, wherein said method further comprises the step of:

f) shifting bit timing of the coded signals by a unit value when said detecting in step (d) detects the overflow condition.

17. A method as claimed in claim 11, wherein the coded symbols have a tree code structure.

18. A method as claimed in claim 17, wherein the coded symbols are convolutional coded symbols.

* * * * *